US012669563B2

(12) United States Patent
Tamada et al.

(10) Patent No.: US 12,669,563 B2
(45) Date of Patent: Jun. 30, 2026

(54) SYSTEM AND METHOD FOR CONFIDENCE MAPS FOR QUANTITATIVE MAPPING WITH MAGNETIC RESONANCE IMAGING

(71) Applicant: Wisconsin Alumni Research Foundation, Madison, WI (US)

(72) Inventors: Daiki Tamada, Madison, WI (US); Scott Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 147 days.

(21) Appl. No.: 18/473,862

(22) Filed: Sep. 25, 2023

(65) Prior Publication Data

US 2025/0102607 A1 Mar. 27, 2025

(51) Int. Cl.
*G01R 33/56* (2006.01)
*G01R 33/54* (2006.01)
*G01R 33/565* (2006.01)

(52) U.S. Cl.
CPC ....... *G01R 33/5608* (2013.01); *G01R 33/543* (2013.01); *G01R 33/56554* (2013.01)

(58) Field of Classification Search
CPC .............. G01R 33/5608; G01R 33/543; G01R 33/56554; G01R 33/243; G01R 33/50; G01R 33/56563; G01R 33/4828
See application file for complete search history.

(56) References Cited

U.S. PATENT DOCUMENTS

2014/0233817 A1* 8/2014 Hernando .......... G01R 33/4828
382/131
2018/0100910 A1* 4/2018 Hernando ........ G01R 33/56554

OTHER PUBLICATIONS

Bley TA, Wieben O, François CJ, Brittain JH, Reeder SB. Fat and water magnetic resonance imaging. Journal of Magnetic Resonance Imaging 2010;31(1):4-18.
Campo CA, Hernando D, Schubert T, Bookwalter CA, Van Pay AJ, Reeder SB. Standardized approach for ROI-based measurements of proton density fat-fraction and R2* in the liver. AJR American journal of roentgenology 2017;209 (3):592.
Caussy C, Reeder SB, Sirlin CB, Loomba R. Noninvasive, Quantitative Assessment of Liver Fat by MRI-PDFF as an Endpoint in NASH Trials. Hepatology 2018;68(2):763-772.
Colgan TJ, Hernando D, Sharma SD, Reeder SB. The effects of concomitant gradients on chemical shift encoded MRI. Magnetic resonance in medicine 2017;78(2):730-738.

(Continued)

*Primary Examiner* — G.M. A Hyder
(74) *Attorney, Agent, or Firm* — Quarles & Brady LLP

(57) ABSTRACT

A system and method are provided for generating at least one confidence map indicating the accuracy of a quantitative map generated from magnetic resonance (MR) data acquired from a subject. The method includes accessing at least one of proton density fat fraction (PDFF) or $R_2^*$ maps of a region of interest (ROI) of a subject produced using chemical-shift encoded magnetic resonance (MR) data acquired from the ROI in the subject, generating at least one confidence map that indicates an accuracy of the at least one of the PDFF or $R_2^*$ maps, and outputting at least one of (i) the at least one confidence map or (ii) a corrected PDFF or $R_2^*$ map that is corrected using the at least one confidence map.

20 Claims, 8 Drawing Sheets

(56) References Cited

OTHER PUBLICATIONS

Colgan TJ, Zhao R, Roberts NT, Hernando D, Reeder SB. Limits of Fat Quantification in the Presence of Iron Overload. J Magn Reson Imaging 2021;54(4):1166-1174.

Cunha GM, Thai TT, Hamilton G, Covarrubias Y, Schlein A, Middleton MS, Wiens CN, McMillan A, Agni R, Funk LM. Accuracy of common proton density fat-fraction thresholds for magnitude- and complex-based chemical shift-encoded MRI for assessing hepatic steatosis in patients with obesity. Abdominal Radiology 2020;45(3):661-671.

Dennis Jr JE. Nonlinear least squares. State of the art in numerical analysis 1977:269-312.

Eggers H, Brendel B, Duijndam A, Herigault G. Dual-echo Dixon imaging with flexible choice of echo times. Magnetic resonance in medicine 2011;65(1):96-107.

Frittoli B, Bertuletti M, Angelini V, Grazioli L. Case series: Clinical application in liver fat and iron quantification using LiverLab. MAGNETOM Flash 2020.

Hernando D, Hines CD, Yu H, Reeder SB. Addressing phase errors in fat-water imaging using a mixed magnitude/complex fitting method. Magnetic resonance in medicine 2012;67(3):638-644.

Hernando D, Kramer JH, Reeder SB. Multipeak fat-corrected complex R2* relaxometry: theory, optimization, and clinical validation. Magnetic resonance in medicine 2013;70(5):1319-1331.

Hernando D, Levin YS, Sirlin CB, Reeder SB. Quantification of liver iron with MRI: state of the art and remaining challenges. Journal of Magnetic Resonance Imaging 2014;40(5):1003-1021.

Hernando D, Vigen KK, Shimakawa A, Reeder SB. R mapping in the presence of macroscopic B0 field variations. Magnetic Resonance in Medicine 2012;68(3):830-840.

Hernando D, Zhao R, Taviani V, Ghasabeh A, Pan L, Yuan Q, Ruschke S, Karampinos DC, Zhong X, Mattison R, Kamel I, Pedrosa I, Vasanawala SS, Yokoo T, Reeder SB. Repeatability and reproducibility of confounder-corrected R2* as a biomarker of liver iron concentration: interim results from a multi-center, multivendor study at 1.5T and 3T. 2019; Montreal, Canada. p 1020.

Hernando D, Zhao R, Yuan Q, Aliyari Ghasabeh M, Ruschke S, Miao X, Karampinos DC, Mao L, Harris DT, Mattison RJ. Multi-center Reproducibility of Liver Iron Quantification with 1.5-T and 3.0-T MRI. Radiology 2022:213256.

Hernando D. ISMRM Fat-Water Toolbox. https://.ismrm.org/workshops/FatWater12/data.htm. Accessed Apr. 14, 2023.

Hu HH, Börnert P, Hernando D, Kellman P, Ma J, Reeder S, Sirlin C. ISMRM workshop on fat-water separation: insights, applications and progress in MRI. Magnetic resonance in medicine 2012;68(2):378-388.

Hu HH, Yokoo T, Bashir MR, Sirlin CB, Hernando D, Malyarenko D, Chenevert TL, Smith MA, Serai SD, Middleton MS. Linearity and bias of proton density fat-fraction as a quantitative imaging biomarker: a multicenter, multiplatform, multivendor phantom study. Radiology 2021;298(3):640-651.

Kannengiesser S, Neji R, Zhong X. Case study LiverLab. MAGNETOM Flash 2014;3:18-19.

Martí-Aguado D, Jiménez-Pastor A, Alberich-Bayarri Á, Rodríguez-Ortega A, Alfaro-Cervello C, Mestre-Alagarda C, Bauza M, Gallén-Peris A, Valero-Pérez E, Ballester MP. Automated whole-liver MRI segmentation to assess steatosis and iron quantification in chronic liver disease. Radiology 2022;302(2):345-354.

McVeigh E, Henkelman R, Bronskill M. Noise and filtration in magnetic resonance imaging. Medical physics 1985; 12 (5):586-591.

Pineda AR, Reeder SB, Wen Z, Pelc NJ. Cramer-Rao bounds for three-point decomposition of water and fat. Magn Reson Med 2005;54(3):625-635.

Reeder SB, Cruite I, Hamilton G, Sirlin CB. Quantitative assessment of liver fat with magnetic resonance imaging and spectroscopy. Journal of magnetic resonance imaging 2011;34(4):729-749.

Reeder SB, Wen Z, Yu H, Pineda AR, Gold GE, Markl M, Pelc

NJJMRiMAOJotlSfMRiM. Multicoil Dixon chemical species separation with an iterative least-squares estimation method. 2004;51(1):35-45.

Reeder SB, Yokoo T, Franca M, Hernando D, Alberich-Bayarri A, Alustiza JM, Gandon Y, Henninger B, Hillenbrand C, Jhaveri K, Karcaaltincaba M, Kuhn JP, Mojtahed A, Serai SD, Ward R, Wood JC, Yamamura J, Marti-Bonmati L. Quantification of Liver Iron Overload with MRI: Review and Guidelines from the ESGAR and SAR. Radiology 2023:221856.

Roberts NT, Hernando D, Holmes JH, Wiens CN, Reeder SB. Noise properties of proton density fat-fraction estimated using chemical shift—encoded MRI. Magnetic resonance in medicine 2018;80(2):685-695.

Roberts NT, Hernando D, Panagiotopoulos N, Reeder SB. Addressing concomitant gradient phase errors in time-interleaved chemical shift-encoded MRI fat-fraction and R2* mapping with a pass-specific phase fitting method. Magnetic Resonance in Medicine 2022;87(6):2826-2838.

Roberts NT, Hinshaw LA, Colgan TJ, Ii T, Hernando D, Reeder Sb. B0 and B1 inhomogeneities in the liver at 1.5 T and 3.0 T. Magnetic resonance in medicine 2021;85(4):2212-2220.

Sirlin CB, Reeder SB. Magnetic resonance imaging quantification of liver iron. Magnetic Resonance Imaging Clinics 2010;18(3):359-381.

Starekova J, Hernando D, Bae WC, Do H, Madhuranthakam A, Malis V, Mukherjee S, Lin SQ, Serai S, Yokoo T, Reeder SB, H Bj, Hernando D. Multi-center, multi-vendor validation of PDFF-R2* mapping in an Optimized Fat-Iron Phantom. ISMRM & ISMRT Annual Meeting & Exhibition. Toronto, Canada2023. p 7863.

Starekova J, Reeder SB. Liver fat quantification: where do we stand? Abdominal Radiology 2020;45(11):3386-3399.

Tang A, Desai A, Hamilton G, Wolfson T, Gamst A, Lam J, Clark L, Hooker J, Chavez T, Ang BD, Middleton MS, Peterson M, Loomba R, Sirlin CB. Accuracy of MR Imaging—estimated Proton Density Fat-Fraction for Classification of Dichotomized Histologic Steatosis Grades in Nonalcoholic Fatty Liver Disease. Radiology 2015;274(2):416-425.

Triay Bagur A, Hutton C, Irving B, Gyngell ML, Robson MD, Brady M. Magnitude-intrinsic water-fat ambiguity can be resolved with multipeak fat modeling and a multipoint search method. Magnetic Resonance in Medicine 2019;82 (1):460-475.

Weaver et al., Confidence Maps for Reliable Proton Density Fat-Fraction Estimation in the Presence of LowSNR, Proc. Intl. Soc. Mag. Reson. Med. 30 (2022) 2285.

Yokoo T, Serai SD, Pirasteh A, Bashir MR, Hamilton G, Hernando D, Hu HH, Hetterich H, Kühn J-P, Kukuk GM. Linearity, bias, and precision of hepatic proton density fat-fraction measurements by using MR imaging: a meta-analysis. Radiology 2018;286(2):486-498.

Yu H, Mckenzie CA, Shimakawa A, Vu AT, Brau ACS, Beatty PJ, Pineda AR, Brittain JH, Reeder SB. Multiecho reconstruction for simultaneous water-fat decomposition and T2* estimation. Journal of Magnetic Resonance Imaging 2007;26(4):1153-1161.

Yu H, Reeder SB, Shimakawa A, Mckenzie CA, Brittain JH. Robust multipoint water-fat separation using fat likelihood analysis. Magnetic resonance in medicine 2012;67(4):1065-1076.

Yu H, Shimakawa A, Hines CDG, Mckenzie CA, Hamilton G, Sirlin CB, Brittain JH, Reeder SB. Combination of complex-based and magnitude-based multiecho water-fat separation for accurate quantification of fat-fraction. Magnetic Resonance in Medicine 2011;66(1):199-206.

Yu H, Shimakawa A, McKenzie CA, Brodsky E, Brittain JH, Reeder SB. Multiecho water-fat separation and simultaneous R estimation with multifrequency fat spectrum modeling. Magnetic Resonance in Medicine: An Official Journal of the International Society for Magnetic Resonance in Medicine 2008;60(5):1122-1134.

Yu H, Shimakawa A, McKenzie CA, Lu W, Reeder SB, Hinks RS, Brittain JH. Phase andecho water-fat separation with bipolar acquisitions. Journal of Magnetic Resonance Imaging:International Society for Magnetic Resonance in Medicine 2010;31(5):1264-1271.

* cited by examiner

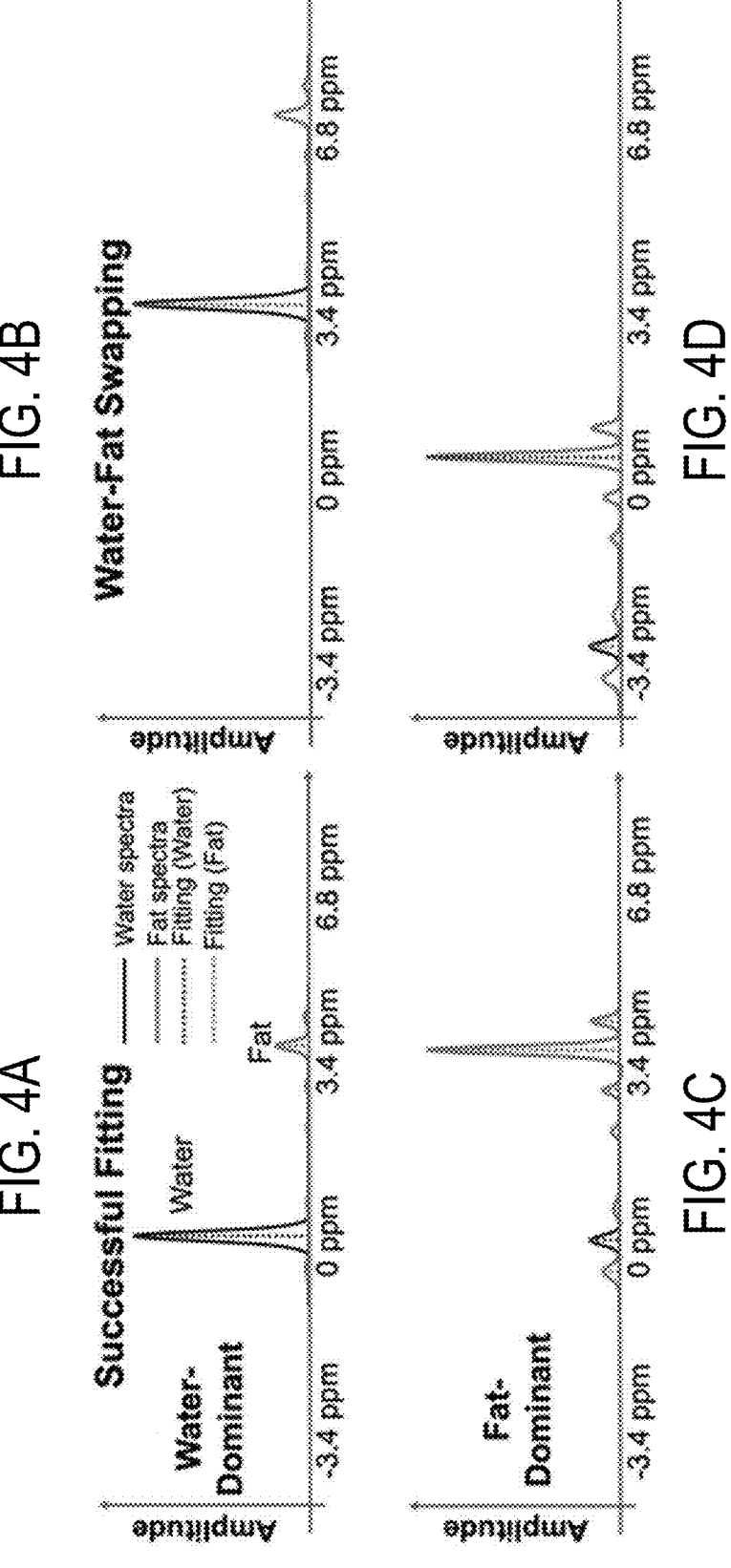

SYSTEM AND METHOD FOR CONFIDENCE MAPS FOR QUANTITATIVE MAPPING WITH MAGNETIC RESONANCE IMAGING

STATEMENT REGARDING FEDERALLY SPONSORED RESEARCH

This invention was made with government support under EB031886 and DK088925 awarded by the National Institutes of Health. The government has certain rights in the invention.

BACKGROUND

The field of the disclosure is systems and methods for magnetic resonance imaging (MRI). More particularly, the disclosure relates to systems and methods for creating confidence maps for quantitative maps produced using magnetic resonance imaging.

When a substance, such as human tissue, is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment, $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or $T_1$) relaxation time or spin-spin (or transverse or $T_2$) relaxation time. The $T_1$ and $T_2$ contrast mechanism are the two most important relaxation mechanisms commonly exploited to provide soft tissue contrast in clinical MRI examinations. Both $T_1$- and $T_2$-weighted acquisitions play a ubiquitous role in almost every clinical MRI exam and are important for a variety of applications including lesion detection, characterization, treatment monitoring, and many other applications. However, there are a variety of other mechanisms for eliciting contrast in MRI, including transverse relaxivity rate ($R_2^*$). Specifically, $R_2^*$ is the inverse of $T_2^*$, which is a quantity related to $T_2$, but includes dephasing effects. That is, $T_2^*$ is a quantity related to spin-spin relaxation and, in addition, relating magnetic field inhomogeneities and susceptibility effects.

These contrast mechanisms can be manipulated by selecting particular imaging parameters utilized while performing a pulse sequence to acquire MR data, so that the images reconstructed form the MR data reflect a particular weighting toward the preferred contrast mechanism that best illustrate the underlying anatomy or pathology that is the focus of the clinical analysis. Since the fundamentals of the pulse sequence and the imaging parameters dictate the contrast weighting, a variety of different pulse sequences and variations on pulse sequences have been developed.

Beyond controlling these contrast mechanisms for purposes of creating anatomical images, which convey qualitative information about the illustrated anatomical structures via the relative contrast in the images, there have been concerted efforts to elicit quantitative information from MR data. For example, instead of qualitative images, some have created quantitative maps using MR data.

As examples, quantitative $T_1$ and $T_2$ mapping have gained attention as a promising approach for the diagnosis and evaluation of various diseases. Proton density fat-fraction (PDFF) and $R_2^*$ estimated using quantitative chemical shift-encoded MRI (CSE-MRI) are well-established quantitative biomarkers of liver fat content. As such, CSE-MRI methods are FDA-approved to evaluate diseases such as non-alcoholic fatty liver disease and liver iron overload. More recently, $R_2^*$ mapping with CSE-MRI been shown to be reproducible across vendors and calibrated to liver iron concentration (LIC, mgFe/g dry).

Despite these efforts, reliable estimation of PDFF and $R_2^*$ remains a challenge because of confounding factors, such as low signal-to-noise ratio (SNR), high iron content, inhomogeneous main magnetic field ($B_0$), and motion. For example, Colgan T J, Zhao R, Roberts N T, Hernando D, Reeder S B. Limits of Fat Quantification in the Presence of Iron Overload. J Magn Reson Imaging 2021; 54(4):1166-1174 investigated the reliability of PDFF estimation in the presence of high $R_2^*$, showing that PDFF measurements may be unreliable above R2* of ~500 s$^{-1}$ and ~800 s$^{-1}$ at 1.5T and 3.0T, respectively.

With low SNR, PDFF estimates demonstrate not only high variability but also bias, due to an asymmetric noise probability density at low SNR. Phase errors caused by hardware imperfections and concomitant field gradients, also introduce bias and poor reliability of PDFF and R2* estimation. Further, water-fat swapping can occur in areas of high $B_0$ inhomogeneity, such as the liver dome. Despite sophisticated methods aimed at preventing water-fat swaps, such swaps remain a challenge, even with commercial methods. Incorrect estimation of the $B_0$ field results from a natural ambiguity in the water and fat signals in water (fat)-dominant pixels, leading to incorrect estimation or quantification of both PDFF and $R_2^*$. Ghosting of adipose tissue signal into the liver can also lead to inaccurate estimation of PDFF and $R_2^*$.

Unbiased estimation of PDFF and $R_2^*$ is needed clinically for accurate diagnosis, staging, and treatment monitoring. For example, differentiation of normal liver from biopsy-based grade 1 hepatic steatosis occurs at a PDFF threshold of ~5.4-6.4%. Unfortunately, most commercial and investigational CSE-MRI methods simply provide reconstructed PDFF and $R_2^*$ maps without any guidance on regions with valid PDFF and/or $R_2^*$ fitting. Regions with inadequate or corrupted estimates of PDFF or $R_2^*$ are often not apparent, even to experienced human analysts.

Algorithms that segment the liver are emerging and hold promise for automated PDFF and $R_2^*$ analysis, making automated identification of valid regions necessary. Without automated methods to exclude invalid regions of PDFF and $R_2^*$ maps, the performance of fully automated analysis of PDFF and $R_2^*$ mapping may be limited.

Therefore, there is a continuing need to provide accurate and understandable PDFF and $R_2^*$ maps that can be used for clinical diagnosis and care.

SUMMARY

The present disclosure overcomes the aforementioned drawbacks by providing systems and methods for to generating confidence maps that identify regions in quantitative maps (such as, for example, PDFF and R$_2$* maps) that are valid for subsequent analysis by clinicians and/or automated algorithms. As such, clinical care is substantially improved by providing clinicians with the information needed to be certain that quantitative maps can be trusted, either for clinician analysis or automated processing.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply magnetic gradients to the polarizing magnetic field. The MRI system further includes a radio frequency (RF) system configured to apply an excitation field to the subject and acquire MR image data from the subject and a computer system. The computer system is programmed to control the plurality of gradient coils and the RF system to perform a multi-echo gradient echo pulse sequence to acquire chemical-shift encoded magnetic resonance (MR) data from a region of interest (ROI) in the subject and estimate at least one of proton density fat fraction (PDFF) or R2* in the ROI using the MR data. The computer system is further programmed to generate at least one confidence map that indicates an accuracy of the estimate of the at least one of the PDFF or R2* in the ROI. The system also includes a display to display one of (i) the at least one confidence map or (ii) a PDFF or R2* map corrected using the at least one confidence map.

In accordance with another aspect of the disclosure, a method is provided for generating at least one confidence map indicating the accuracy of a quantitative map generated from magnetic resonance (MR) data acquired from a subject. The method includes accessing, using a computer system, at least one of a proton density fat fraction (PDFF) map or R2* map produced from the MR data and processing, using the computer system, the at least one of the PDFF map or R2* map using a threshold to identify spatial locations in the PDFF map or R2* map with at least one of poor quality of signals for PDFF or R2* measurements or water-fat swaps. The method further includes communicating, using the computer system, a report including at least one of (i) the spatial locations with poor quality of signals for PDFF or R2* measurements or water-fat swaps or (ii) a PDFF or R2* map corrected using the spatial locations with poor quality of signals for PDFF a or R2* measurements or water-fat swaps.

In accordance with yet another aspect of the disclosure, a non-transitory, computer-readable storage medium is provided having stored thereon instructions that, when executed by a computer processor, causes the computer processor to carry out steps. The steps includes accessing at least one of proton density fat fraction (PDFF) or R2* maps of a region of interest (ROI) of a subject produced using chemical-shift encoded magnetic resonance (MR) data acquired from the ROI in the subject, generating at least one confidence map that indicates an accuracy of the at least one of the PDFF or R2* maps, and outputting at least one of (i) the at least one confidence map or (ii) a corrected PDFF or R2* map that is corrected using the at least one confidence map.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A is a graph showing a successful water-dominant fitting using a multi-peak signal model.

FIG. 4B is a graph showing an unsuccessful water-dominant fitting using a multi-peak signal model.

FIG. 4C is a graph showing a successful fat-dominant fitting using a multi-peak signal model.

FIG. 4D is a graph showing an unsuccessful fat-dominant fitting using a multi-peak signal model.

DETAILED DESCRIPTION

Figure 1:
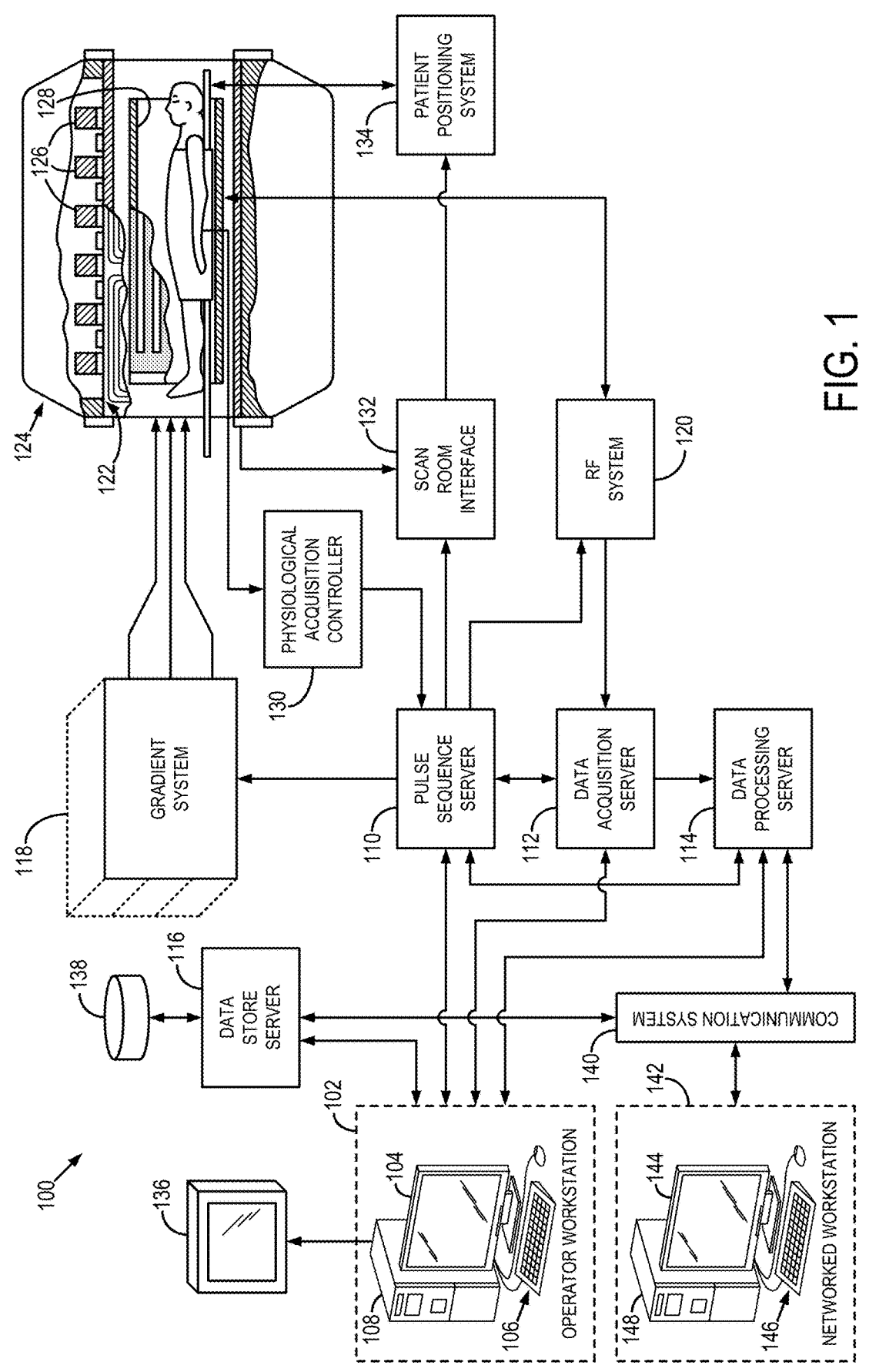
FIG. 1 is a block diagram of an exemplary magnetic resonance imaging (MRI) system configured in accordance with the present disclosure.

Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2}; \qquad \text{Eqn. 1}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heartbeat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110. As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be processed remotely by a networked workstation 142. This data may be exchanged in any suitable format, such as in accordance with the transmission control protocol (TCP), the internet protocol (IP), or other known or suitable protocols.

Figure 2:
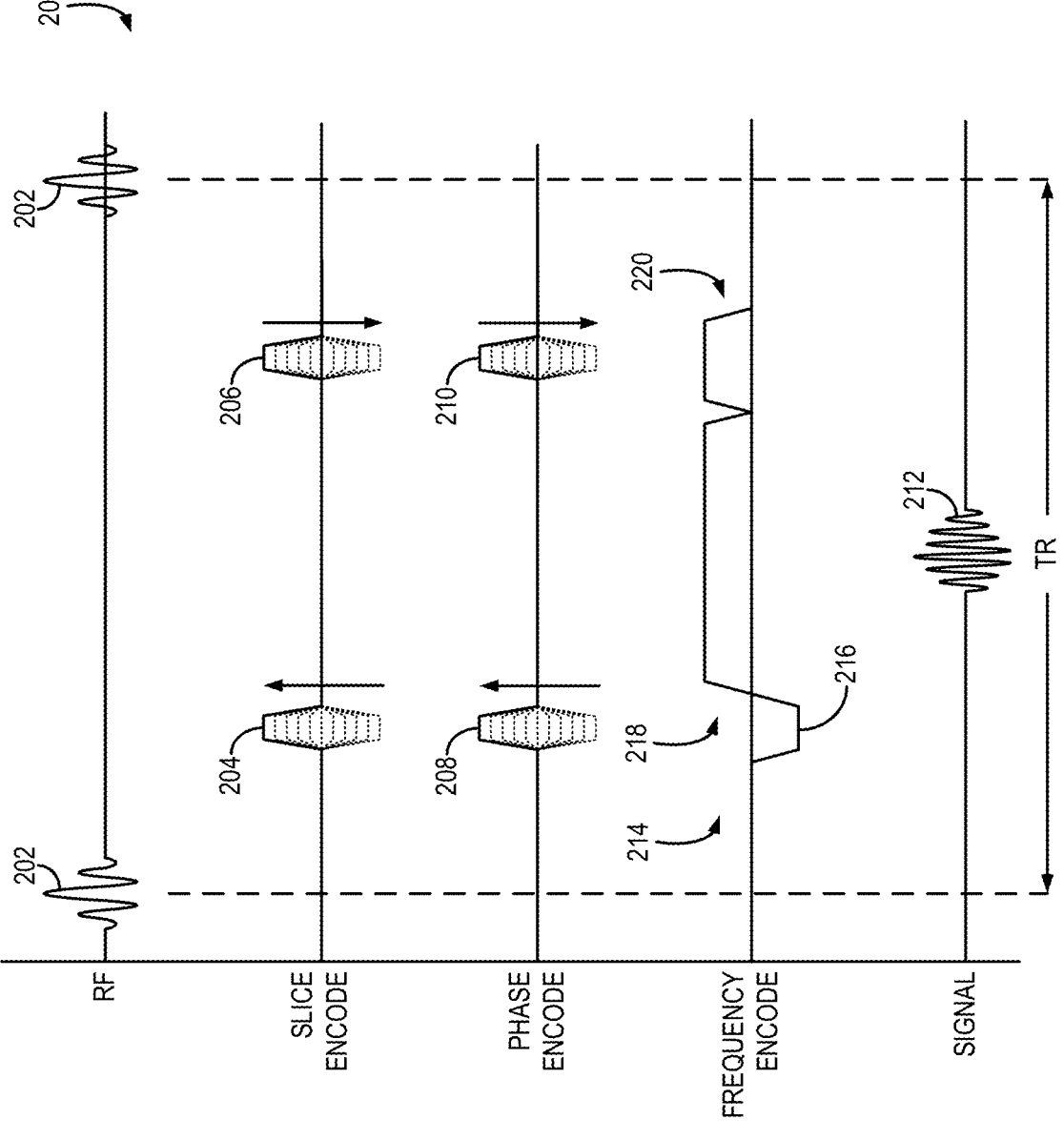
FIG. 2 is a graphic representation of an exemplary pulse sequence for directing the MRI system of FIG. 1 in accordance with the present disclosure.

The above-described MRI system of FIG. 1 can be used to implement a variety of pulse sequences to effectuate desired imaging studies. Furthermore, the systems and/or computers or processors described above can be programmed to carry out image or map reconstructions and/or derive a variety of clinically-desired metrics or measures. One category of pulse sequence is the gradient echo (GRE) sequence and variations thereof, such as spoiled gradient echo (SGRE) acquisitions. Referring to FIG. 2, one non-limiting example of a pulse sequence 200 in accordance with the present disclosure is provided. In particular, the pulse sequence 200 of FIG. 2 is a GRE pulse sequence designed in accordance with the present disclosure. That is, as will be described, a multi-echo spoiled gradient echo pulse sequence can be used to provide simultaneous confounder-corrected estimation of PDFF and $R_2^*$ values and/or a confidence map.

The pulse sequence 200 of FIG. 2 begins with a radio frequency (RF) pulse 202, followed by slice and phase encoding achieved using respective slice-selective gradients 204, 206 and phase-encoding gradients 208, 210. In particular, following excitation of the nuclear spins in the imaging slice prescribed by the slice encoding gradients 204, 206, phase encoding gradients 208, 210 are applied to spatially encode the elicited echoes 212. A series of readout gradients 214 are also applied starting with a dephasing gradient lobe 216 followed by the readout encoding 218 to spatially encode the echo 212 along a second, orthogonal direction in the prescribed imaging slice. Finally, a spoiler gradient 220 is applied. On selected passes or repetitions of the pulse sequence 200, the pulses may be varied.

As described above, proton density fat-fraction (PDFF) and transverse relaxivity rate ($R_2^*$) acquired using a pulse sequence 200 such as described with respect to FIG. 2 to perform quantitative chemical shift-encoded MRI (CSE-MRI) studies are valuable biomarkers of diffuse liver disease. For MR elastography in the liver region, several automated algorithms have been proposed. However, such analysis can be readily undermined by costly "call-backs" of the patient when the resulting data is unreliable.

That is, reliable PDFF and $R_2^*$ quantification or estimation remains challenging due to confounding factors such as low SNR, high iron (high $R_2^*$), inhomogeneous magnetic field ($B_0$), and phase errors. In addition, water-fat swaps commonly occur in water- or fat-dominant pixels. Further, severe magnetic field inhomogeneities can lead to focally elevated and unreliable R2* and even PDFF estimates. Thus, a quantitative PDFF or $R_2^*$ map may not clearly show the regions with inadequate or corrupted measurements, and there is a lack of guidance in current CSE-MRI methods, for objective identification of invalid regions of the maps.

Despite the plethora of compounding confounding or corrupting factors, the present disclosure is able to tell clinicians (or computerized analysis systems or algorithms) the amount of confidence that should be placed in a given measurement. As a non-limiting example, the systems and methods provided herein have identified a variety of scenarios that can lead to biased or incorrect values and provides systems and methods or communicating the amount of confidence that should be placed in a given value, even when multiple confounding or corrupting factors are present together compounding the obscurity of the measure.

As one non-limiting example, multiple scenarios have been identified that can lead to biased estimation or high variability of PDFF and/or $R_2^*$ values. As some non-limiting examples, these scenarios can include (i) low SNR of underlying source images; (ii) moderate iron overload leading to invalid PDFF estimation, but valid $R_2^*$ estimation; (iii) severe iron overload, leading to both invalid PDFF and $R_2^*$ estimation; (iv) extraneous phase or amplitude errors in complex CSE-MRI methods; (v) water-fat/fat-water swapping; and/or (vi) tissues adjacent to areas of high susceptibility, such as metallic implants. Furthermore, as will be described, the present disclosure recognizes that PDFF and/or $R_2^*$ measures in pixels suffering from bias or high variability can be excluded from subsequent analysis and reporting.

The present disclosure recognizes that PDFF and $R_2^*$ measures exhibit increased variability and bias when SNR is low. CSE-MRI images have independent additive noise, resulting in variability in both signal magnitude and phase. Thus, whether using complex CSE-MRI data (magnitude and phase), magnitude only CSE-MRI data (discarding phase of the signal), or hybrid CSE-MRI data (a combination of complex and magnitude data or a combination of the resulting magnitude fitting and complex fitting), poor SNR in underlying echo images can lead to high variability and bias in PDFF and $R_2^*$ maps. Noise does not propagate linearly in PDFF and $R_2^*$ maps, making it difficult for experts to determine when SNR is sufficient.

The present disclosure further recognizes that signal decay caused by moderate iron overload worsens SNR in later echoes at higher echo time (TE) values. Though SNR may be adequate to estimate $R_2^*$ reliably, water-fat separation and, therefore, PDFF estimation may be difficult. In the spectral domain, increasing $R_2^*$ leads to line-width broadening and, when sufficiently severe, merges water and fat into an inseparably broad peak. More severe iron overload results in insufficient SNR to estimate either $R_2^*$ and PDFF.

The present disclosure recognizes that phase or amplitude errors may be caused by a variety of sources, including eddy currents, concomitant gradients, or spurious phase or amplitude errors. Such phase or amplitude errors can lead to biased estimates of both PDFF and $R_2^*$. Successful strategies have been proposed to address eddy currents and concomitant gradients. However, it can be challenging to identify incompletely corrected or other spurious phase- or amplitude-related PDFF and $R_2^*$ estimation errors. Phase and amplitude errors lead to anatomically accurate and visibly plausible PDFF and $R_2^*$ maps, but with large quantitative errors not easily appreciated visually.

The present disclosure further recognizes that water-fat swapping occurs in regions with relatively high $B_0$ inhomogeneity, such as the liver dome. Swaps lead to bias in not only PDFF estimate, but also $R_2^*$ because the spectral model of water (single-peak) and fat (multi-peak) are not the same. A pixel with a water-fat swap will inappropriately fit signal to the wrong spectral model, and the multi-peak interference of fat with itself will lead to an apparent under- (over-) estimation of $R_2^*$. Water-fat swaps are generally easy for expert human analysts to identify, although this is generally impractical to implement when using automated segmentation algorithms.

Further still, signal dephasing in tissue adjacent to sources of severe focal susceptibility, such as metallic implants and or abrupt tissue-air interfaces, can lead to overestimation of $R_2^*$, and bias in PDFF.

In one, non-limiting example, a 6-peak model may be used to generate an estimate of PDFF and $R_2^*$ from MR data acquired using a multi-echo spoiled gradient echo pulse sequence, such as described above with respect to FIG. 2.

In this context, multiple species of fat can be addressed as:

$$s(t) = \left(\rho_w + \rho_f \sum_{p=1}^{6} \alpha_p \cdot e^{i2\pi f_p t}\right) \cdot e^{i2\pi\psi t}; \qquad \text{Eqn. 3}$$

where $\rho_w$ and $\rho_f$ are the complex signal amplitude of water and fat components, $\alpha_p$ and $f_p$ are relative amplitudes and frequencies for $p^{th}$ peak of fat such that $$\Sigma_{p=1}^{6}\alpha_p = 1,$$

$\psi$ is the "complex field map" that includes off-resonance frequency $\psi_0$ (Hz) and R2* (s$^{-1}$), defined as:

$$\psi = \psi_0 + \frac{iR_2^*}{2\pi}; \qquad \text{Eqn. 4}$$

where PDFF is defined as:

$$PDFF = \frac{|\rho_f|}{|\rho_w| + |\rho_f|}. \qquad \text{Eqn. 5}$$

PDFF and $R_2^*$ can be estimated using iterative or non-linear estimation algorithms. Since this problem is non-convex, challenges such as inhomogeneous $B_0$ fields, low SNR, high $R_2^*$, and water-fat swaps, can result in inaccurate estimation of PDFF and/or $R_2^*$.

Inaccurate PDFF or $R_2^*$ undercut the ability to use this information clinically. That is, in these situations, not only can the information be inaccurate, but there is no way for the clinician to identify or determine and distinguish inaccurate information from accurate information. To overcome this problem, the present disclosure provides systems and methods to create confidence maps that identify inappropriate or inaccurate estimations of PDFF and R2* under a wide variety of scenarios, including all of those described above.

In one non-limiting example, to develop confidence maps, three classes can be identified. The first class can be defined by situations where poor SNR and/or phase (or amplitude) errors of the acquired signals are a potential source of inaccuracies. This first class can apply to all six scenarios above. The second class can be defined by a failure of $B_0$ estimation, which applies to the fifth scenario described above—water-fat swapping. The third class can be defined by an overestimation of $R_2^*$ due to severe local suscepti-bility, which applies to the sixth scenario described above—tissues adjacent to areas of high susceptibility.

Using this construct, multiple confidence maps can be generated. For example, referring to FIG. 3, a process 300 for producing a confidence map in accordance with the present disclosure may produce multiple confidence maps, which may be delivered as a report and/or outputting indi-vidually or together.

Figure 3:
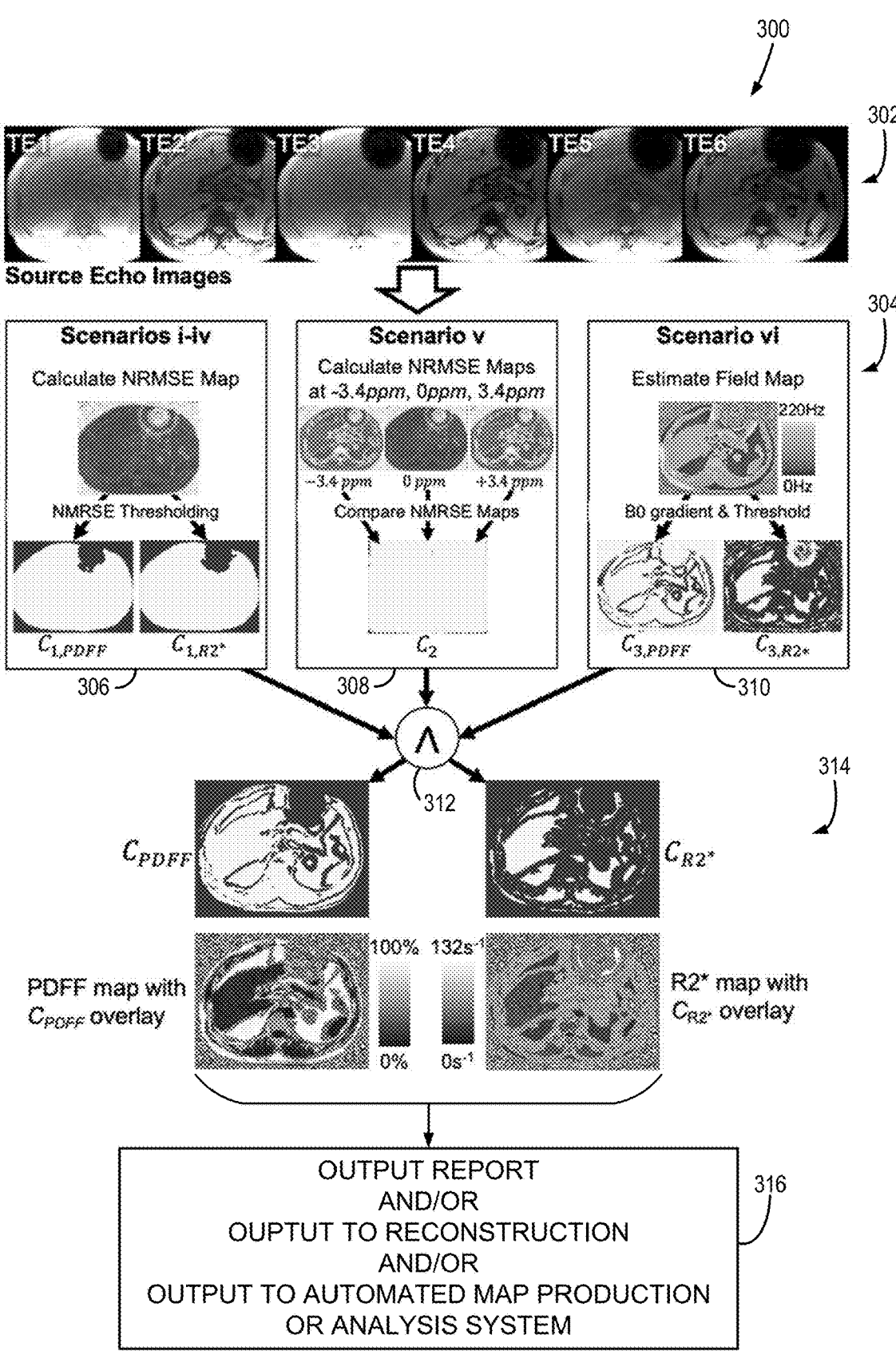
FIG. 3 is a graphical flow chart setting forth some non-limiting steps of a method for generating confidence maps in accordance with the present disclosure.

Referring to FIG. 3, at a first stage 302, multiple source echo images are acquired. As used herein, acquiring multiple source echo images may include acquiring MR data from a subject, such as using the MRI system of FIG. 1 and a pulse sequence such as described with respect to FIG. 2. Alterna-tively, acquiring multiple source echo images may include accessing MR data or MR images stored on a computer system or in a memory of a computer system. Regardless of the source of the data or images, PDFF and $R_2^*$ maps are reconstructed using a CSE-MRI algorithm with multi-peak signal modeling.

The first stage 304 can include multiple processing steps that can be performed in parallel or series. For example, at process block 306, masks ($C_{1,PDFF}$, $C_{1,R2*}$) can be used to identify areas with poor quality of signals for PDFF and $R_2^*$ measurements, which can be calculated based on the nor-malized root-mean-square error (NRMSE). Cramer-Rao Lower Bound, and Monte-Carlo simulation can provide confidence threshold of NRMSE.

More particularly, the first mask can identify areas with poor quality signals for estimation of $C_{1,PDFF}$ and $C_{1,R2*}$. Confidence maps can be based on the NRMSE between the measured signal and CSE-MRI signal model, in the least-squares sense (i.e., L2 norm). Any NRMSE value above a pre-determined threshold criteria may be utilized. A process for determining the threshold using Cramér-Rao Lower Bound (CRLB) and Monte-Carlo analyses will be described below.

At process block 308, the NRMSE for signal fitting with and without off-resonance shifts (±3.4 ppm) can be com-pared to detect water-fat swapping ($C_2$). That is, the NRMSE can also be used to assess water-fat swaps generated using forced water-fat swaps, by comparing each fit with signal models that have off-resonance frequencies to enforce a water-fat swap, and estimating the probability of a water-fat swap. Note that PDFF and $R_2^*$ can share the same mask for water-fat swaps, hence $C_2(r)=C_{2,PDFF}(r)=C_{2,R2*}(r)$.

Furthermore, at process block 310, to exclude areas with strong $R_2^*$ decay due to susceptibility effect, susceptibility effect masks ($C_{3,PDFF}$ and $C_{3,R2*}$) can be calculated based on the local $B_0$ gradient. For example, severe local susceptibil-ity caused by metallic implants or air-tissue interfaces, can be evaluated using the local spatial gradient of the $B_0$ inhomogeneity ($\psi_0$) to generate $C_{3,PDFF}$ and $C_{3,R2*}$.

Finally, in addition to these specific confidence map focused on scenarios i-iv produced at process block 306, the confidence map focused on scenario v produced at process block 308, and/or the confidence map focused on scenario vi produced at process block 310, overall confidence maps for PDFF and $R_2^*$ can be derived by using the binary AND 312 combination of $C_1$, $C_2$, and $C_3$. As one non-limiting example, the overall confidence maps for PDFF and $R_2^*$ can be determined through the binary AND operation as:

$$C_{PDFF}(r) = C_{1,PDFF}(r) \wedge C_2(r) \wedge C_{3,PDFF}(r) \qquad \text{Eqn. (6)}$$
$$C_{R2*}(r) = C_{1,R2*}(r) \wedge C_2(r) \wedge C_{3,R2*}(r);$$

where $\wedge$ represents the AND operator and noting that $C_2(r)=C_{2,PDFF}(r)=C_{2,R2*}(r)$ for water-fat swaps. The result-ing confidence maps for PDFF and $R_2^*$ maps indicate areas with high and low reliability for ROI-based analysis. Thus, as illustrated, multiple classes of confidence maps can be generated, as illustrated at 314. Therefore, the systems and methods provided herein can produce confidence map(s) for PDFF and $R_2^*$ maps generated using CSE-MRI. Confidence maps can be based on NRMSE values, in combination with masking for the presence of water-fat swaps and areas of high local magnetic susceptibility.

At process block 316, the system or algorithm may create any of a variety of outputs. For example, the confidence maps may be individually compiled to generate a report. Additionally or alternatively, the confidence maps may be combined. Additionally or alternatively, the confidence maps may be output to a reconstruction process for the quantitative maps, which may include elastograms.

The systems and methods provided herein can be used to predict the presence of water-fat swaps and this information may be incorporated into the PDFF and $R_2^*$ map reconstruction, which can obviate the need to mask regions of water-fat swaps. Additionally or alternatively, the confidence maps may be incorporated into an automated map production or analysis system, such as to supplement or supplant expert analysis, such as described below.

Evaluation for Quality of Acquired Signal

The reliability of PDFF and $R_2^*$ estimates can be evaluated using the NRMSE between the measured and fitted signals and non-linear least squares estimation. This method evaluates the agreement between the measured and modeled complex signal, defined as:

$$NRMSE = \frac{1}{\hat{y}} \sqrt{\sum_{n=1}^{N} \frac{(y_n - \hat{y}_n)^2}{N}};$$   Eqn. (7)

where $y_i$ and $\hat{y}_n$ are the measured and estimated complex signals at $n^{th}$ echo and $\hat{y}$ is the mean value of the measured signals. NRMSE is a convenient metric to provide a confidence threshold, defined as:

$$C_1(r) = \begin{cases} 1 & \text{if } NRMSE(r) \leq \tau \\ 0 & \text{if } NRMSE(r) > \tau \end{cases};$$   Eqn. (8)

where $r$ is the spatial coordinate of the map and $\tau$ is a predetermined threshold value, above which the signals from voxel at position $r$ do not adequately fit the signal model to be considered reliable.

The threshold $\tau$ can vary with PDFF and $R_2^*$, as well as pulse sequence parameters, most notably first echo time ($TE_1$), echo spacing ($\Delta TE$) and echo train length. In one configuration, the values of $r$ was studied as a function of PDFF, $R_2^*$, $TE_1$, and $\Delta TE$ using the CRLB and Monte-Carlo simulations, as described below, for a fixed echo train length of six.

Detection of Water-Fat Swapping

Water-fat swapping is a well-known challenge with CSE-MRI caused by incorrect estimation of the $B_0$ field map resulting from fitting to a local minimum, particularly in water- or fat-dominant pixels. Swaps are commonly seen in the liver dome but can occur anywhere. Since swapping leads to highly biased estimates of both PDFF and $R_2^*$, it can be important to exclude these regions.

Water-fat swapping often occurs two ways with CSE-MRI. For PDFF values below 50%, when a swap occurs, the estimated field map ($\psi_0$) is estimated at +3.4 ppm higher than the true $B_0$ field, corresponding to the methylene peak of fat. This results in overestimation of PDFF, and is common with typical PDFF values observed in the liver. When PDFF exceeds 50% and a swap occurs, the estimated field map is underestimated by −3.4 ppm, which corresponds to the water peak, and PDFF is underestimated.

That is, referring to FIGS. 4A-4D, there are two general scenarios that cause water-fat swapping with multi-peak signal modeling. Referring to FIG. 4A, for PDFF<50%, the estimated off-resonance frequency is overestimated, when with a water-fat swap caused by an error in $B_0$ estimation, as shown in FIG. 4B. Referring to FIG. 4C, for PDFF>50%, off-resonance and PDFF is underestimated, with a water-fat swap, as show in in FIG. 4D. The over- or under-estimation of off-resonance leads to an increased NRMSE since a residual component of fitting remains, since the spectral models of water (single peak) and fat (multipeak) are different.

When swaps occur, the agreement between measured and fitted signals decreases, due to differences in the spectral model of water (single peak) and fat (multipeak), leading to an increase in the NRMSE. A swap can be enforced by fitting the signal with a shift of +3.4, −3.4 ppm relative to the estimated frequency, by substituting the frequency term as:

$$\psi_0 \leftarrow \psi_0 + \Delta\psi;$$   Eqn. (9)

where $\Delta\psi$ is the off-resonance shift corresponding to ±3.4 ppm (e.g., ±217 Hz at 1.5T). Calculating NRMSE values for each fitted signals can be used to predict the presence of a swap. Since the fitting with lower NRMSE should be correct, the confidence map which is reflecting swapping can be defined as:

$$C_2(r) = \begin{cases} 1 & \text{if } NRMSE(r) \leq NRMSE_{\Delta\psi=\pm3.4}(r) \\ 0 & \text{if } NRMSE(r) \leq NRMSE_{\Delta\psi=\pm3.4}(r) \end{cases};$$   Eqn. (10)

where $NRMSE_{\Delta\psi=\pm3.4}$ is NRMSE for the fitted signal with the off-resonance shift. This principle has been proposed to exploit the spectral complexity of fat to mitigate fat-water swaps.

Detection of Focal Susceptibility Gradients

Strong local off-resonance due to sources of susceptibility such as metallic implants or tissue-air interfaces, accelerates signal decay and lead to local over-estimation of the apparent $R_2^*$. The $B_0$ field gradient in the largest voxel dimension (usually slice) can be used to exclude regions of high susceptibility by using gradient threshold $\kappa$ as:

$$C_{3,R2^*}(r) = \begin{cases} 1 & \text{if } \Delta \cdot G > \kappa \\ 0 & \text{if } \Delta \cdot G \leq \kappa \end{cases};$$   Eqn. (11)

with $$G \equiv \frac{\partial}{\partial z}(\psi_0);$$   Eqn. (12)

where $\psi_0$ is the estimated $B_0$ map from equation (4), $\Delta$ denotes the largest voxel dimension (e.g., slice direction), and $z$ is the coordinate system in that direction. The $B_0$ map can also be approximated from the phase difference of any two or more echo images if $B_0$ estimation from CSE-MRI is unreliable due to rapid signal decay (e.g., severe $R_2^*$). The echo images should be selected such that the phase of water and fat signals are similar, to prevent estimation errors caused by differences in off-resonance between water and fat. Gradient thresholds, $\kappa$, can be chosen based on numerical simulations of $R_2^*$ decay with $B_0$ field gradients.

Specifically, Bloch equation simulations of signal decay due to $B_0$ field gradients using a point spread function approach can be used to estimate $\kappa$ for equation (11). Assuming a rectangular slice profile, the additional $R_2^*$ decay due to the macroscopic $B_0$ field gradients in a specific direction can be expressed by:

$$s(t, G) = \left( \rho_w + \rho_f \sum_{p=1}^{P} \alpha_p \cdot e^{j2\pi f_p t} \right) \cdot e^{j2\pi \psi(z)t} \cdot \Delta \cdot \mathrm{sinc}(\gamma \cdot \Delta \cdot G \cdot t); \quad \text{Eqn. (13)}$$

where G is the field gradient defined in equation (12). A field gradient can be assumed along the largest voxel dimension, which is typically the slice direction with CSE-MRI in the liver. Although these assumptions may not be entirely accurate for 3D acquisitions, the proposed method provides practical criteria.

That is, the algorithm was validated for detecting focal susceptibility gradients using a case involving metal implant artifacts. $R_2^*$ and field gradient ($\Delta G$) in the left lobe, which is close to the implant artifacts, were measured in a ROI. In this analysis, $R_2^*$ measurement bias ($\Delta R_2^*$) was calculated pixel-pixel by subtracting the mean $R_2^*$ (32.6 1/s) in the right lobe from the measured $R_2^*$. A scatter plot of $\Delta R_2^*$ against $\Delta G$ showed that measurement bias tended to increase as $\Delta G$ increases, especially above 20 Hz. For the mean $R_2^*$, the algorithm predicted 8.3 Hz, which provides reasonable criteria for measurement, although it is a conservative number.

Although an assumption of ideal slice profile and field gradient along only slice direction may be used, the results indicated that the result was sufficient. To obtain more accurate threshold value, the three-dimensional distribution of field gradient and realistic spatial response function of 3D imaging can be used.

The apparent $R_2^*$, which includes the effects of the $B_0$ gradient, can be calculated from the full width half maximum (FWHM) of frequency domain of the signal as:

$$R2^{*\dagger}(\Delta \cdot G) = \frac{1}{\pi \cdot FWHM(\Delta \cdot G)}; \quad \text{Eqn. (14)}$$

such that the bias of R2* estimation ($\Delta R2^*$) is defined as:

$$\Delta R2^*(\Delta \cdot G) = R2^{*\dagger}(\Delta \cdot G) - R2^*. \quad \text{Eqn. (15)}$$

Threshold criteria ($\kappa$) can be chosen such that the bias on $R_2^*$ estimates are within a desired range such that:

$$\kappa = \arg \min_G |\Delta R2^*(\Delta \cdot G) - R2_T^*|; \quad \text{Eqn. (16)}$$

where $R2^*_T$ is the maximum acceptable $R_2^*$ bias.

PDFF estimates can also be affected by $B_0$ gradients, although generally less so than $R_2^*$. Mild field gradients still allow for accurate estimation because they broaden the water and fat spectra, which manifests as an $R_2^*$ overestimation, leaving PDFF relatively unaffected. When the field gradient reaches a sufficient amplitude, the spectra become highly broadened, leading to complicated signal decay, and failure of PDFF estimation.

Therefore, the susceptibility effect map for PDFF can be defined as:

$$C_{3,PDFF}(r) = \begin{cases} 1 & \text{if } \Delta \cdot G > \kappa' \\ 0 & \text{if } \Delta \cdot G \leq \kappa'' \end{cases}; \quad \text{Eqn. (17)}$$

where $G_\tau$ is cutoff gradient value that allows acceptable bias. In this study, values for $\kappa'$ of 51 Hz and 93 Hz for 1.5T and 3.0T were used, respectively. These values were determined using Monte-Carlo simulations.

Cramér-Rao Lower Bound (CRLB) and Monte-Carlo (MC) Simulation

CRLB and MC simulations can be used to determine NRMSE thresholds in two steps. First, the minimum SNR necessary to meet the target variability (as characterized by the standard deviation of PDFF and $R_2^*$) can be determined by using CRLB. MC and nonlinear regression analyses can then be used to obtain regression models that establish the relationship between SNR and NRMSE. These analyses provide the relationship between NRMSE and standard deviation, indirectly, and assumes that the estimators of PDFF and $R_2^*$ are efficient, which is generally the case for most CSE-MRI methods.

The CRLB, derived from the signal model, such as equation (3) for CSE-MRI, provides a theoretical lower bound on the variance of any unbiased estimator for PDFF ($CRLB_{PDFF}$) and $R_2^*$ ($CRLB_{R2*}$) estimated for a specific combination of PDFF, $R_2^*$, $TE_1$, $\Delta TE$, and SNR, assuming a fixed echo train length.

Using ROI analysis, analysts typically estimate the mean of the estimated values from a region of tissue, with Z independent samples. The minimum SNR is chosen such that standard error (SE) of the mean of the estimated PDFF or $R_2^*$ value is below an acceptable variance threshold. In this work, SE is defined as:

$$SE = \frac{\sigma}{\sqrt{Z}}; \quad \text{Eqn. (18)}$$

where $\sigma$ is a standard deviation of PDFF or $R_2^*$, and Z is the number of independent samples in an ROI. Threshold criteria for variability in PDFF and $R_2^*$ estimates, and Z will vary depending on specific applications. The minimum SNR values needed to achieve reliable estimates are obtained by solving the following minimization problems, $$SNR_{PDFF}(x) = \arg\min_{SNR} \left| \frac{CRLB_{PDFF}(SNR, x)}{\sqrt{Z}} - SE_{PDFF} \right| \quad \text{Eqn. (19)}$$

$$SNR_{R2*}(x) = \arg\min_{SNR} \left| \frac{CRLB_{R2*}(SNR, x)}{\sqrt{Z}} - SE_{R2*} \right|;$$

with $$x = (PDFF, R2^*, TE1, \Delta TE); \quad \text{Eqn. (20)}$$

where $CRLB_{PDFF}$ and $CRLB_{R2*}$ are the minimum standard deviation, calculated from CRLB analysis for PDFF and $R_2^*$, respectively; $SE_{PDFF}$ and $SE_{R2*}$ are acceptable SE for PDFF and $R_2$, respectively. $SNR_{PDFF}$ and $SNR_{R2*}$ are calculated over a range of plausible $TE_1$, $\Delta TE$, PDFF, and $R_2^*$ values.

Because accurate SNR measurements can be a challenge, in general, an approach to estimate SNR from NRMSE can be used. To determine the relationship between NRMSE and SNR, MC simulations can be performed with variable PDFF, $R_2^*$, $TE_1$, $\Delta TE$, and SNR values, and repeated Z times for each set of parameters to replicate measurements within a region of interest (ROI) containing Z pixels, simulating an ROI measurement from a PDFF or $R_2^*$ map. Mean NRMSE and SNR values were measured from the repeated calculations and plotted. An empirical function F(SNR) representing the NRMSE for a specific SNR value can be obtained by fitting the curves, for example, with a neural network regression model.

Using this relationship, thresholds of NRMSE for PDFF and $R_2^*$ can be estimated by combining the obtained two regressions as:

$$\tau_{PDFF}(x) = F(SNR_{PDFF}(x)) \quad ; \quad \text{Eqn. (21)}$$
$$\tau_{R2^*}(x) = F(SNR_{R2^*}(x))$$

where $\tau_{PDFF}$ and $\tau_{R2^*}$ are the thresholds used in equation 6 to determine the reliability of PDFF and $R_2^*$ measurements.

EXPERIMENTS

Thus, as described above, a system and method are provided to provide confidence maps. To evaluate the performance of the confidence map algorithm, MC simulations, phantom, and in vivo experiments were performed. The generation of the quantitative PDFF and $R_2^*$ maps used for the confidence maps was performed offline using the ISMRM Fat-Water toolbox. Water and fat images, and PDFF and $R_2^*$ maps were reconstructed from complex images using a nonlinear least-squares estimation method. Confidence maps for PDFF and $R_2^*$ were independently generated pixel-by-pixel using the equation (6), and final PDFF and $R_2^*$ maps with confidence map overlays were exported as DICOM images for phantom and in vivo experiments.
Confidence Map A broad physiologically plausible range of $R_2^*$ and PDFF were used, along with broad but plausible ranges for $TE_1$, $\Delta TE$, SNR, and off-resonance frequency. The range for PDFF and was chosen from 0-100%, and the range for $R_2^*$ was 25-500 $s^{-1}$ at 1.5T and 25-1000 $s^{-1}$ at 3.0T, respectively, based on previous studies. The ranges of $TE_1$ (0.9-1.8 and 0.6-1.0 ms for 1.5T and 3.0T, respectively) and $\Delta TE$ (1.1-2.2 and 0.55-1.1 ms for 1.5T and 3.0T, respectively) were based on that typically allowed by vendors, and past optimizations. Off-resonance frequencies of −14.5-81.3 Hz and −31.7-164.0 Hz for 1.5T and 3.0T, respectively were used based on the known variability of B0 in the liver. SNR of the first echo was varied between 2-50. An echo train length of 6 was chosen, as this value is widely used for clinical CSE-MRI acquisitions.

Criteria for reliable measurements of PDFF and $R_2^*$ were determined based on previous clinical studies. Specifically, the coefficients of repeatability for PDFF and $R_2^*$ in the liver were investigated based on prior in-vivo studies. It has reported that PDFF measurement using CSE-MRI showed repeatability coefficients of 2.99%, respectively. For $R_2^*$, it has been reported that the test-retest $R_2^*$ repeatability using Bland-Altman analysis at both 1.5T (95% limit of agreement (LOA): −14.2-16.9%, Bias: 1.4%) and 3.0T (95% LOA: −16.6-15.5%, Bias: −0.6%) as part of a multi-center, multi-vendor study.

Based on these results, the thresholds were chosen to lead to standard error (SE) values much less that these coefficients of repeatability to avoid impacting the test-retest variability of CSE-MRI. Specifically, the selections were made to achieve a SE of 1% (absolute) or less for PDFF, and less than 3% (relative) or 5 $s^{-1}$ (whichever is larger) for $R_2^*$. A circular ROI was assumed with 2.8 cm diameter, corresponding to 100 pixels for in-plane spatial resolution of 2.0×3.0 $mm^2$, typical for CSE-MRI.
Simulation Experiments Monte-Carlo (MC) simulations using signal generated with the model in equation (3) were performed (MATLAB 2021b) to evaluate the performance of the proposed confidence map algorithm. The same ranges of parameters for $R_2^*$, PDFF, $TE_1$, $\Delta TE$, SNR, and off-resonance frequency as those assumed for the confidence map were applied. Zero-mean complex Gaussian noise was added to the simulated signal to vary SNR. The variance of the estimated values of PDFF and $R_2^*$ for a particular NRMSE was calculated using a binned scatterplot.

Additional MC simulations were used to evaluate the performance of the proposed water-fat swap detection method using the same parameter range explained above. We implemented the algorithm in equation (8) and plotted probabilities that successfully detected swapping against NMRSE for 1.5T and 3.0T.

To obtain an empirical relationship between $SNR_{PDFF}$ and $SNR_{R2^*}$ with NMRSE, the results from equation (19) were fit to a shallow neural network regression model consisting of three fully connected hidden layers with 10 neurons using the fitrnet function provided in MATLAB. The same model was used for fitting F, which showed the relationship between NRMSE and SNR.

$R_2^*$ bias due to macroscopic B0 inhomogeneity was calculated with variable $R_2^*$ (25-1000 $s^{-1}$) and $B_0$ using equations (13)-(15). An empirical relationship between the $B_0$ gradient and $R_2^*$ was developed to determine the threshold $\kappa$ in equation (11), obtained by fitting the calculated results to polynomial regression model up to $3^{rd}$ order, followed by the application of equation (16).
Phantom Experiments Phantom experiments were performed to validate the performance of the confidence map algorithm. A prototype phantom (Calimetrix, Madison, WI) consisting of 16 vials with simultaneously varying PDFF and $R_2^*$ enclosed within a spherical housing unit was used. PDFF and $R_2^*$ maps were acquired using a 3.0T clinical MR system (Signa Premier, GE Healthcare, Waukesha, WI). Acquisition parameters are summarized in Table 1.

TABLE 1

| | Phantom | In vivo | |
| --- | --- | --- | --- |
| | 3.0T | 1.5T | 3.0T |
| TR | 6.2 ms | 8.3-13.6 ms | 4.9-7.5 ms |
| TE1 | 1.0 ms | 0.9-1.7 ms | 0.9-1.0 ms |
| ΔTE | 0.7 ms | 1.8-2.1 ms | 0.59-1.0 ms |
| # Echoes | 3 | 3 | 3 |
| # Interleaved Echo Trains | 2 | 2 | 2 |
| Receiver Bandwidth | 781 Hz/px | 651 Hz/px | 781 Hz/px |

TABLE 1-continued

| | Phantom | In vivo | |
| --- | --- | --- | --- |
| | 3.0T | 1.5T | 3.0T |
| FOV | 40 cm | 40-46 cm | 36-40 cm |
| Slice Thickness | 2 mm | 7.8-10 mm | 8-10 mm |
| Number of slices | 20 | 56-72 | 28-36 |
| Matrix Size | 160 × 160 | 184 × 112-192 × 160 | 116 × 104-192 × 160 |
| Flip Angle | 1 | 5° | 3-4° |
| NSA | 1, 9 | 0.5 | 0.5 |

To obtain low SNR images, a flip angle of 1° was used. An increasing number of signal averages (NSA) from 1-9 was used to vary SNR. To perform quantitative analysis, PDFF and $R_2$* values were measured. ROIs were placed in each vial to perform a box plot analysis. The above-described systems and methods for creating confidence maps were applied to the acquired maps.

In Vivo Experiments

A prospective clinical study was performed by performing a retrospective analysis of CSE-MRI data collected from consecutive patients undergoing PDFF and $R_2$* measurements in the liver as part of clinical MR exams. Imaging for the subjects was implemented using various 1.5T and 3.0T clinical MR systems (GE Healthcare, Waukesha, WI). A commercial CSE-MRI method (IDEAL-IQ GE Healthcare, Waukesha, WI) with imaging parameters listed in Table 1 was used.

A board-certified radiologist delineated ROIs for each of 9 liver segments blinded to the confidence maps. The percent area of the ROIs was then calculated in areas that were identified by the confidence map as invalid. In this way, we aimed to determine the impact of confidence maps on clinical analysis, since those areas would have been avoided if the confidence maps had been made available to the radiologist or an automated segmentation algorithm.

Results

Figures 5A, 5B:
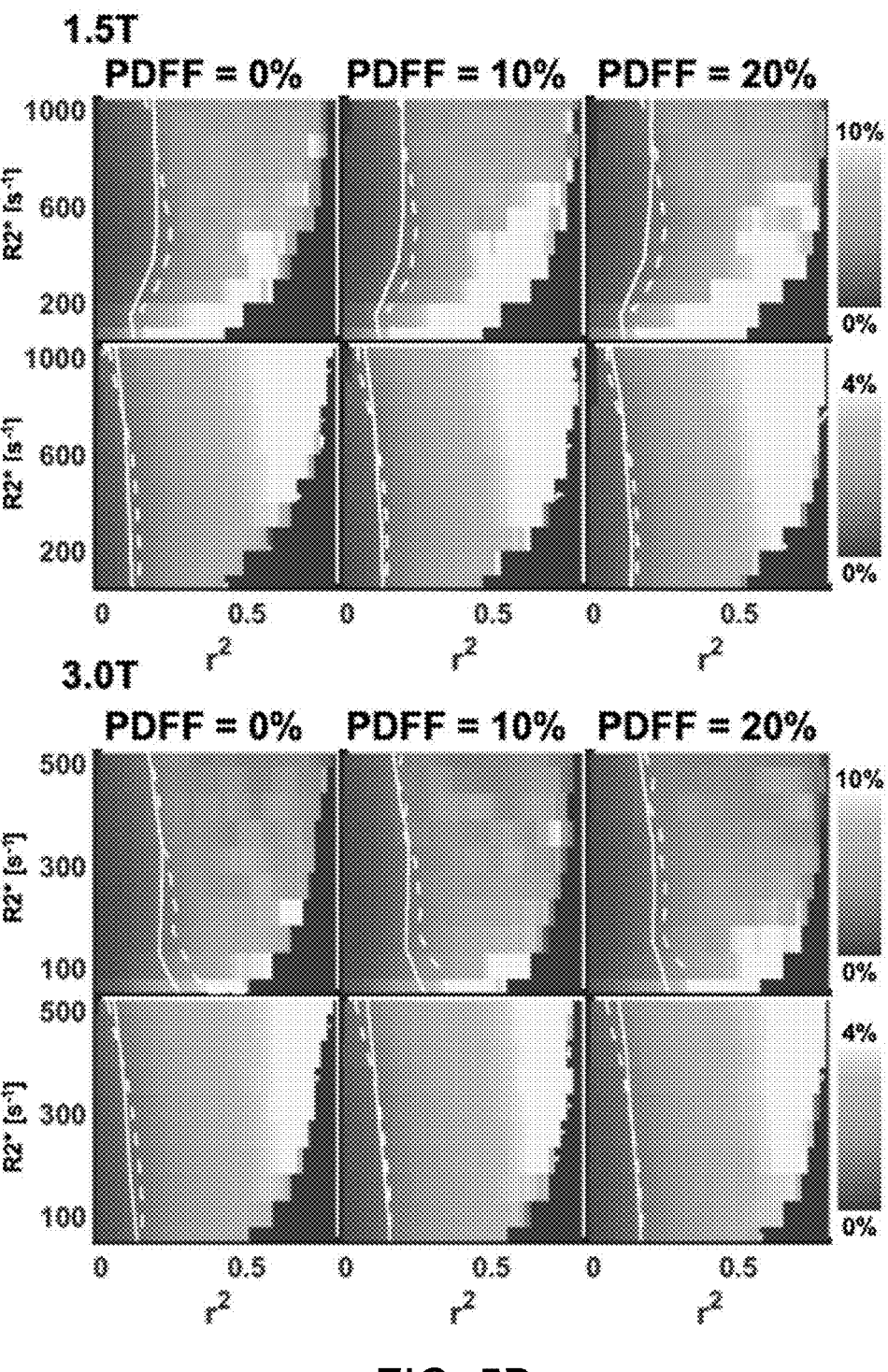
FIG. 5A is a plot showing a set of PDFF and R2* thresholds for NMRSE at 1.5T.
FIG. 5B is a plot showing a set of PDFF and R2* thresholds for NMRSE at 3.0T.

Referring to FIGS. 5A and 5B, plots are provided that are a function of NRMSE and $R_2$* for $R_2$* and PDFF calculated using MC simulations with 1.5T and 3.0T, respectively. Threshold values calculated using the above-described systems and methods (white solid lines) agree with estimates from MC simulations (dotted line). The plots also demonstrate that threshold values are moderately dependent on $R_2$* but less dependent on PDFF.

Figures 6A, 6B:
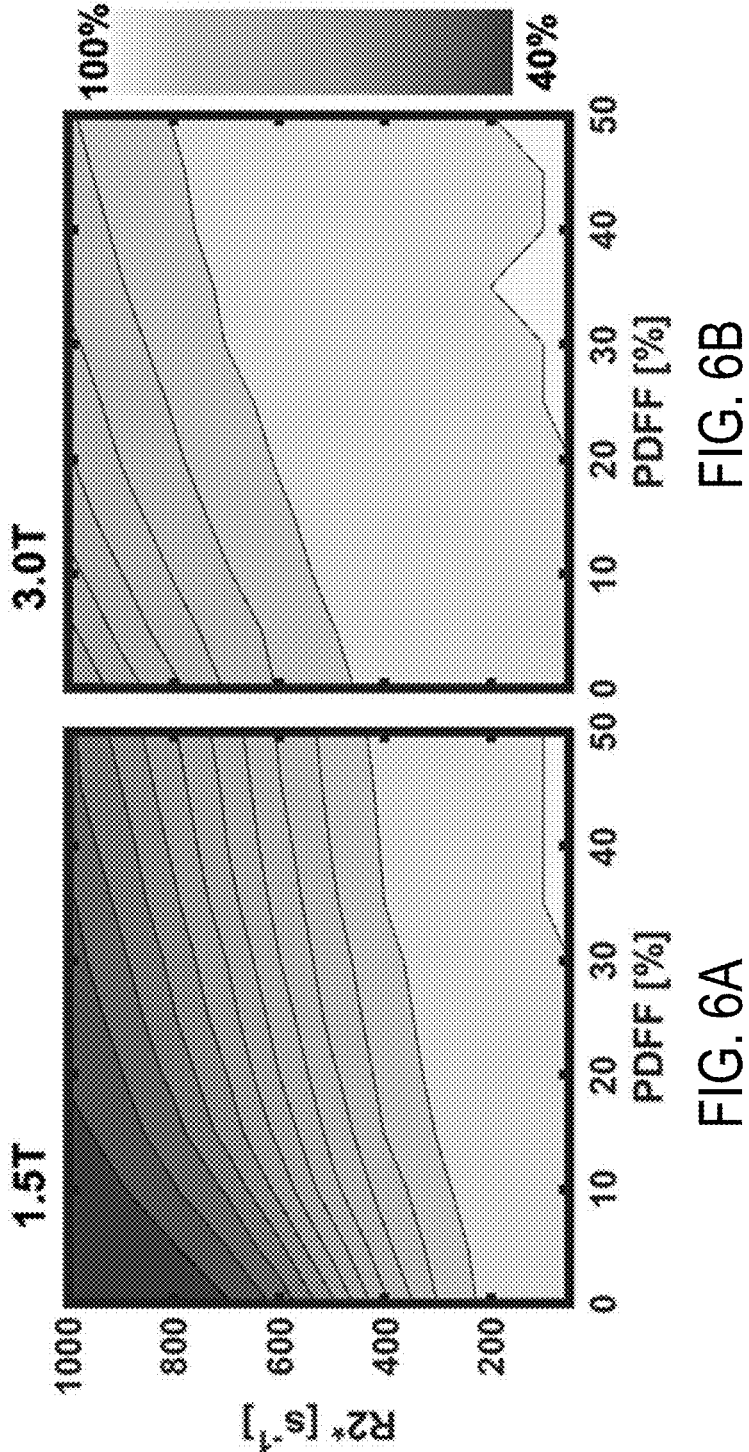
FIG. 6A is a plot showing a probability of water-fat swapping as a function of PDFF and R$_2$* for 1.5T.
FIG. 6B is a plot showing a probability of water-fat swapping as a function of PDFF and R$_2$* for 3.0T.

MC simulations reveal water-fat swapping can be successfully detected using the proposed method for wide range of PDFF and $R_2$* values. FIGS. 6A and 6B show the probability of water-fat swapping as a function of PDFF and $R_2$* for 1.5T (FIG. 6A) and 3.0T (FIG. 6B).

The above-described systems and methods can detect swapping with, in this limited context, 80% probability for most PDFF and $R_2$* values. The probability of a water-fat swap detection drops dramatically at high $R_2$*, as expected.

Figures 7A, 7B, 7C:
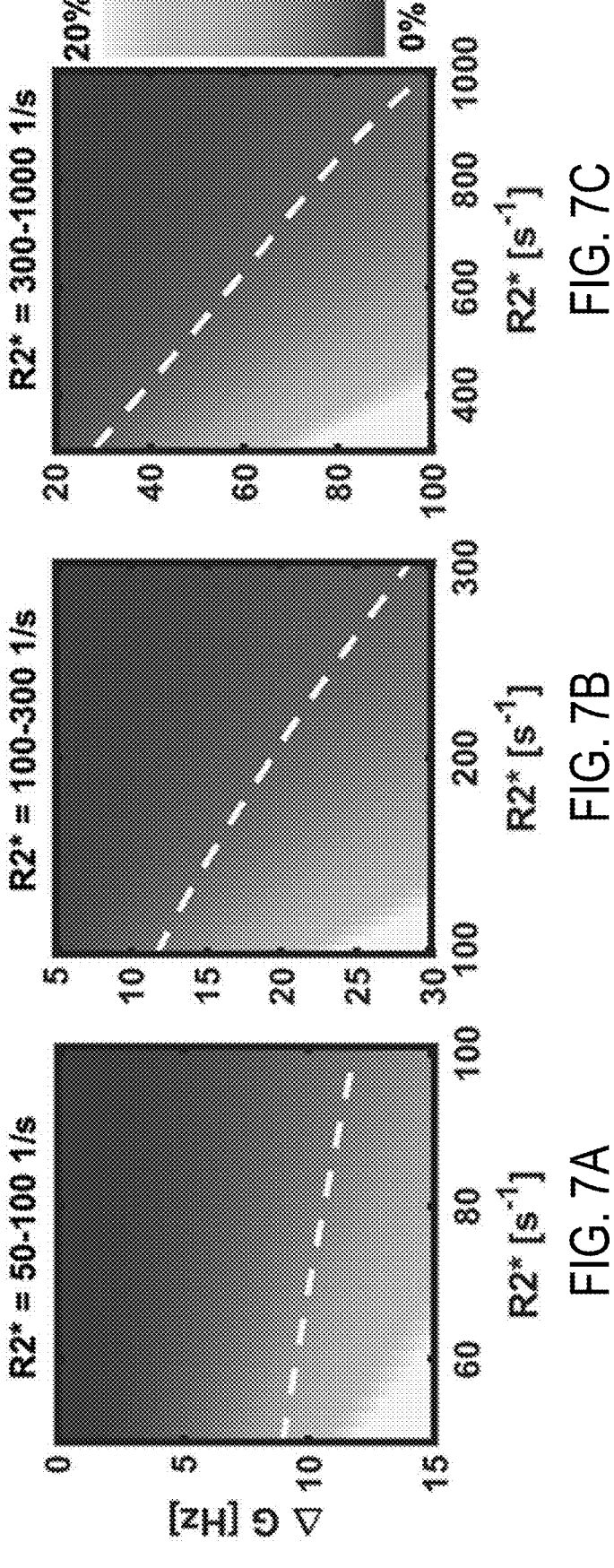
FIG. 7A is a plot of bias in percentage of R$_2$* measurement as a function of field gradient and R$_2$* showing that, at lower value of R$_2$, a relatively small field gradient could provide non-negligible bias.
FIG. 7B is a plot of bias in percentage of R$_2$* measurement as a function of field gradient and R$_2$* showing a medium value of R$_2$.
FIG. 7C is a plot of bias in percentage of R$_2$* measurement as a function of field gradient and R$_2$* showing that, at a high-R$_2$* range, bias could be neglected regardless of the field gradient.

FIGS. 7A-7C are plots of the estimation bias in % associated with low- (50-100 $s^{-1}$), mid- (100-300 $s^{-1}$), and high-$R_2$* (300-1000 $s^{-1}$) due to $B_0$ inhomogeneities. There is a strong relationship between estimation bias and $B_0$ gradient and $R_2$*. A relatively small $B_0$ gradient will lead to some bias at low $R_2$* values, whereas high $R_2$* values are less biased. Based on these results, threshold values for $B_0$ gradients are shown as the white dotted lines in FIGS. 7A-7C, for use with equation (16).

Figure 8:
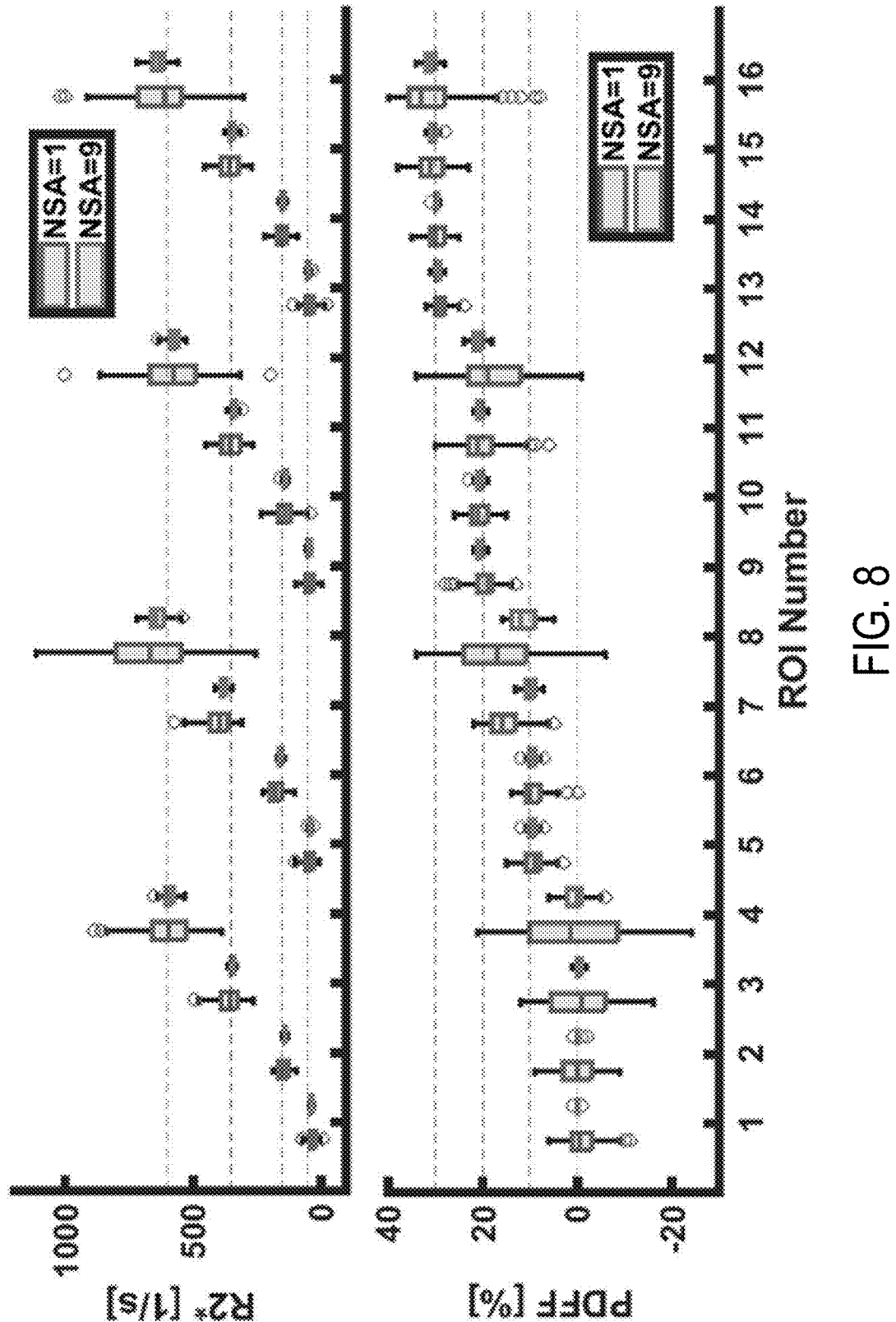
FIG. 8 is a set of box plots for PDFF and R2* showing the median, first/third quartile, and minimum/maximum values for each vial in a phantom study.

Data from the phantom experiments demonstrated that the systems and methods provided herein identified areas not suitable for PDFF and $R_2$* measurements under various SNR conditions. The PDFF and $R_2$* maps obtained with high SNR (NSA=9) had appropriate SE values for PDFF and $R_2$* measurements. Similarly, the systems and methods described herein identified regions with poor SE in PDFF and $R_2$* for the low SNR acquisition (NSA=1). ROIs in vials 4, 8, 12, and 16 in the PDFF map acquired with NSA=1 were excluded as unreliable PDFF (SE=1.1%, 1.7%, 0.79%, 0.71%). The systems and methods also identified most of vials 8 and 16 as invalid for analysis (SE=3.7%, 2.4%). The box plots of FIG. 8 show how these ROIs have relatively high PDFF and/or $R_2$* variability.

Raw data from 100 consecutive patients (1.5T: 51, 3.0T: 49 patients, 51:49 men:women, 56 range: 18-82 years) who underwent CSE-MRI of the liver as part of their clinical MR exam was successfully collected and reconstructed as described above. PDFF and $R_2$* maps with high $R_2$* (>500 $s^{-1}$), as well as histograms with PDFF and $R_2$* values from ROIs located in the right lobe, demonstrated that the systems and methods provided herein successfully identified unreliable regions. A measurement of this example indicated unacceptable variability (SE=1.7%) in PDFF maps, while $R_2$* (SE=2.3%) was within the defined criteria. A metal implant in the abdominal wall caused severe susceptibility artifacts in both PDFF and $R_2$* maps and was properly identified using the systems and methods provided herein. Most fatty regions in $R_2$* were masked out because the $B_0$ field gradient was above the defined threshold (κ), which was caused by interface between fat and water tissues. These regions were successfully masked using the confidence maps.

In total, 832 ROIs were placed by the radiologist, with 68 ROIs not placed due to poor image quality, such as motion artifacts. ROI analysis by the radiologist revealed that 2.6% and 15% of the area of the ROIs in PDFF and $R_2$* maps were placed inside unreliable areas identified by confidence maps. Notably, 5.4% and 49% of ROIs for PDFF and $R_2$* maps, respectively, had more than 10% of invalid pixels. Further, there were significant differences in PDFF (4.3%±4.4%) and $R_2$* (18.7 $s^{-1}$±34 $s^{-1}$) measurements with and without confidence maps in 1% and 12% of the cases, respectively. Twenty-six cases had water-fat swapping, and two had severe focal metal artifacts, respectively. Furthermore, three cases had unreliable PDFF due to moderate levels of $R_2$*, while $R_2$* estimates were acceptable. No cases with extreme $R_2$* values were seen.

Thus, the systems and methods described herein were validated in both in vitro and in vivo settings and generated confidence maps for PDFF and $R_2$* maps measured in the liver using CSE-MRI. Confidence maps were generated based on NRMSE values between the signal model and measured signals. Further, areas of water-fat swapping and regions of severe susceptibility artifact from metal were excluded. Monte-Carlo simulations, a phantom study and clinical study demonstrated the validity and utility of the proposed algorithm.

The systems and methods described herein can generate confidence maps as an output and/or can be part of an automated system and method to identify reliable and unreliable regions of PDFF and $R_2$* maps. Such maps are clinically valuable because they provide clinicians with accurate and precise estimates of PDFF and $R_2$* needed to diagnose, stage, and monitor treatment of patients with, for example, liver disease. The systems and methods provided herein can be used to avoid inappropriate ROI placement by analysts and can improve the quality and consistency of PDFF and $R_2$* measurements.

The systems and methods provided herein can be used for a variety of CSE-MRI applications. That is, the experiments provided above were applied in the clinical context of liver imaging. However, the systems and methods provided herein are not limited to this clinical setting or liver imaging. The threshold values may vary depending on specific applications. However, the systems and methods provided herein can be applied to any CSE-MRI measurement by changing simply adjusting threshold used to generate the confidence maps.

As described above, invalid regions of $R_2$* and/or PDFF estimation can be relatively common. Furthermore, focal severe susceptibility artifacts can occur with non-negligible frequency. It is important to note that, although the expert radiologist can exclude inappropriate areas in many cases, confidence maps are important aids for non-expert analysts, and necessary for fully automated tools.

The present disclosure recognizes that several estimation algorithms exist for PDFF and $R_2$*. It may be desirable to adjust the threshold used for the confidence map for a given algorithm.

In some implementations, devices or systems disclosed herein can be utilized or installed using methods embodying aspects of the invention. Correspondingly, description herein of particular features or capabilities of a device or system is generally intended to include disclosure of a method of using such features for intended purposes and of implementing such capabilities. Similarly, express discussion of any method of using a particular device or system, unless otherwise indicated or limited, is intended to inherently include disclosure of the invention, as embodiments of the invention, the utilized features and implemented capabilities of such device or system.

As used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "only one of," or "exactly one of." For example, a list of "only one of A, B, or C" indicates options of: A, but not B and C; B, but not A and C; and C, but not A and B. In contrast, a list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more A, one or more B, and one or more C. Similarly, a list preceded by "a plurality of" (and variations thereon) and including "or" to separate listed elements indicates options of one or more of each of multiple of the listed elements. For example, the phrases "a plurality of A, B, or C" and "two or more of A, B, or C" indicate options of: one or more A and one or more B; one or more B and one or more C; one or more A and one or more C; and one or more A, one or more B, and one or more C.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
   a magnet system configured to generate a static magnetic field ($B_0$) about at least a portion of a subject arranged in the MRI system;
   a plurality of gradient coils configured to apply magnetic gradients to the polarizing magnetic field;
   a radio frequency (RF) system configured to apply an excitation field to the subject;
   a computer system programmed to:
      control the plurality of gradient coils and the RF system to perform a multi-echo gradient echo pulse sequence to acquire chemical-shift encoded magnetic resonance (MR) data from a region of interest (ROI) in the subject;
      estimate at least one of proton density fat fraction (PDFF) or $R_2$* in the ROI using a complex signal model and the MR data by performing at least one of:
      identifying areas in the ROI with signals for PDFF or $R_2$* measurements below a threshold selected by the computer system,
      identifying water-fat swapping in the MR data identified by the computer system, or
   excluding areas in the ROI with invalid PDFF or $R_2$* measurements identified by the computer system;
      generate at least one confidence map that indicates an accuracy of the estimate of the at least one of the PDFF or $R_2$* in the ROI; and
   a display to display one of (i) the at least one confidence map or (ii) a PDFF or $R_2$* map corrected using the at least one confidence map.

2. The MRI system of claim 1, wherein the computer system is further programmed to use masks to evaluate the estimate of the at least one of the PDFF or $R_2$* in the ROI and select the threshold to identify the areas in the ROI with signals for PDFF or $R_2$* measurements below the threshold.

3. The MRI system of claim 2, wherein the threshold includes a normalized root-mean-square-error (NRMSE) threshold calculated by the computer system.

4. The MRI system of claim 1, wherein the computer system is further programmed to identify water-fat swapping in the MR data by performing a set of calculations of water-fat separation with fixed off-resonance shifts.

5. The MRI system of claim 4, wherein the fixed off-resonance shifts include +3.4 ppm and −3.4 ppm relative to an estimated frequency.

6. The MRI system of claim 1, wherein, to exclude areas in the ROI with invalid PDFF or $R_2$* measurements, the computer system is further programmed to analyze the MR data to detect $R_2$* decay caused by local magnetic field variations.

7. The MRI system of claim 1, wherein the computer system is further configured to generate multiple confidence maps using multiple processing stages and combine the multiple confidence maps into an overall confidence map.

8. A method for generating at least one confidence map indicating the accuracy of a quantitative map generated from magnetic resonance (MR) data acquired from a subject, the method comprising:

accessing, using a computer system, at least one of a proton density fat fraction (PDFF) map or $R_2^*$ map produced from the MR data using a complex signal model;

the computer system identifying, using the at least one of the PDFF map or $R_2^*$ map and a threshold, spatial locations in the PDFF map or $R_2^*$ map with at least one of poor quality of signals for PDFF or $R_2^*$ measurements or water-fat swaps; and communicating, using the computer system, a report including at least one of (i) the spatial locations with poor quality of signals for PDFF or $R_2^*$ measurements or water-fat swaps or (ii) a PDFF or $R_2^*$ map corrected using the spatial locations with poor quality of signals for PDFF or $R_2^*$ measurements or water-fat swaps.

9. The method of claim 8, further comprising, using the computer system, identifying spatial locations with strong $R_2^*$ decay due to susceptibility effects and indicating the spatial locations with strong $R_2^*$ decay due to susceptibility effects in the report or using the spatial locations with strong $R_2^*$ decay due to susceptibility effects to correct the PDFF or $R_2^*$ map.

10. The method of claim 8, further comprising, using the computer system to identify water-fat swapping by performing a set of calculations of water-fat separation with fixed off-resonance shifts.

11. The method of claim 10, wherein the fixed off-resonance shifts include at least +3.4 ppm and −3.4 ppm relative to an estimated frequency.

12. The method of claim 8, further comprising, using the computer system, generating a confidence map for each step of a multi-stage process of:

(a) spatial locations in the PDFF map or $R_2^*$ map with at least one of poor quality of signals for PDFF or $R_2^*$ measurements;

(b) spatial locations in the PDFF map or $R_2^*$ map that are subject to water-fat swaps; and (c) spatial locations with strong $R_2^*$ decay due to susceptibility effects.

13. The method of claim 12, further comprising, using the computer system, combining each confidence map of steps (a) through (c) into an overall confidence map.

14. The method of claim 8, further comprising, using the computer system, at least one of:

displaying the report;

using the report to reconstruct a corrected PDFF or $R_2^*$ map; or using the report in an automated map production or analysis system.

15. A non-transitory, computer-readable storage medium having stored thereon instructions that, when executed by a computer processor, causes the computer processor to carry out steps comprising:

accessing at least one of proton density fat fraction (PDFF) or $R_2^*$ maps of a region of interest (ROI) of a subject produced using chemical-shift encoded magnetic resonance (MR) data acquired from the ROI in the subject;

generating at least one confidence map that indicates an accuracy of the at least one of the PDFF or $R_2^*$ maps and identifying spatial locations with strong $R_2^*$ decay; and outputting at least one of (i) the at least one confidence map or (ii) a corrected PDFF or $R_2^*$ map that is corrected using the at least one confidence map.

16. The storage medium of claim 15, further comprising generating the at least one confidence map using a multi-stage process including steps comprising:

identifying spatial locations in the at least one PDFF or $R_2^*$ map with at least one of poor quality of signals for PDFF or $R_2^*$ measurements;

identifying spatial locations in the at least one of PDFF or $R_2^*$ map for water-fat swaps; and identifying spatial locations in the at least one of PDFF or the $R_2^*$ map for strong $R_2^*$ decay due to susceptibility effects.

17. The storage medium of claim 16, further comprising generating a confidence map for each step of the multi-stage process.

18. The storage medium of claim 17, further comprising combining the confidence map for each step of the multi-stage process into an overall confidence map.

19. The storage medium of claim 18, further comprising communicating the overall confidence map to at least one of a report display, an image reconstruction process, or an automated map process.

20. The storage medium of claim 15, wherein generating the at least one confidence map includes processing the at least one of the PDFF or $R_2^*$ map using a threshold to identify spatial locations in the at least one of PDFF or $R_2^*$ map with at least one of poor quality of signals for PDFF or $R_2^*$ measurements or water-fat swaps.

* * * * *